(12) United States Patent
Ikegawa et al.

(10) Patent No.: US 10,297,443 B2
(45) Date of Patent: May 21, 2019

(54) SEMICONDUCTOR DEVICE MANUFACTURING METHOD AND SEMICONDUCTOR DEVICE MANUFACTURING SYSTEM

(71) Applicant: TOKYO ELECTRON LIMITED, Tokyo (JP)

(72) Inventors: Hiroaki Ikegawa, Nirasaki (JP); Jun Ogawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/465,144

(22) Filed: Mar. 21, 2017

(65) Prior Publication Data

US 2017/0278698 A1    Sep. 28, 2017

(30) Foreign Application Priority Data

Mar. 22, 2016  (JP) .................... 2016-057341

(51) Int. Cl.
*C23C 16/34*  (2006.01)
*C23C 16/52*  (2006.01)
(Continued)

(52) U.S. Cl.
CPC ........ *H01L 21/0228* (2013.01); *C23C 16/345* (2013.01); *C23C 16/45536* (2013.01); *C23C 16/45544* (2013.01); *C23C 16/52* (2013.01); *C23C 16/56* (2013.01); *H01L 21/0217* (2013.01); *H01L 21/02211* (2013.01); *H01L 21/02274* (2013.01); *H01L 21/31111* (2013.01); *H01L 21/31116* (2013.01); *H01L 21/67069* (2013.01); *H01L 21/67745* (2013.01); *H01L 21/68771* (2013.01)

(58) Field of Classification Search
None
See application file for complete search history.

(56) References Cited

U.S. PATENT DOCUMENTS

| 8,722,510 B2 * | 5/2014 | Watanabe ......... H01L 21/02164 |
| | | 257/E21.547 |
| 8,945,339 B2 * | 2/2015 | Kakimoto ........... C23C 16/0272 |
| | | 118/696 |

(Continued)

FOREIGN PATENT DOCUMENTS

JP    10144675 A    5/1998

*Primary Examiner* — Telly D Green
(74) *Attorney, Agent, or Firm* — Nath, Goldberg & Meyer; Jerald L. Meyer

(57) ABSTRACT

A semiconductor device manufacturing method includes: a primary process of supplying a process gas to a substrate having a depression formed therein to form a third layer and filling the depression with the third layer, the substrate including a first layer whose surface is exposed as an upper surface of the substrate and a second layer formed in at least a sidewall of the depression having the sidewall and a floor surface; performing an etching process of etching the third layer to expose the upper surface, and halting the etching of the third layer while remaining the third layer formed within the depression; and performing a secondary process of supplying the process gas to the substrate to form the third layer so that the depression is filled with the third layer with no clearance.

6 Claims, 8 Drawing Sheets

(51) Int. Cl.
*C23C 16/56* (2006.01)
*H01L 21/02* (2006.01)
*H01L 21/67* (2006.01)
*C23C 16/455* (2006.01)
*H01L 21/311* (2006.01)
*H01L 21/677* (2006.01)
*H01L 21/687* (2006.01)

(56) References Cited

U.S. PATENT DOCUMENTS

| | | | |
|---|---|---|---|
| 9,865,499 B2 * | 1/2018 | Sato | H01L 21/76802 |
| 2001/0028922 A1 * | 10/2001 | Sandhu | C23C 16/045 |
| | | | 427/255.27 |
| 2007/0152333 A1 * | 7/2007 | Lee | H01L 21/28562 |
| | | | 257/751 |
| 2012/0028437 A1 * | 2/2012 | Watanabe | H01L 21/02164 |
| | | | 438/425 |
| 2012/0103518 A1 * | 5/2012 | Kakimoto | C23C 16/0272 |
| | | | 156/345.1 |
| 2012/0267341 A1 * | 10/2012 | Kato | H01L 21/02164 |
| | | | 216/37 |
| 2016/0379868 A1 * | 12/2016 | Sato | H01L 21/76802 |
| | | | 438/703 |

* cited by examiner

SEMICONDUCTOR DEVICE MANUFACTURING METHOD AND SEMICONDUCTOR DEVICE MANUFACTURING SYSTEM

CROSS-REFERENCE TO RELATED APPLICATION

This application claims the benefit of Japanese Patent Application No. 2016-057341, filed on Mar. 22, 2016, in the Japan Patent Office, the disclosure of which is incorporated herein in its entirety by reference.

TECHNICAL FIELD

The present disclosure relates to a technique for performing a film forming process with respect to a depression formed in a surface of a substrate used for manufacturing a semiconductor device so as to fill the depression.

BACKGROUND

As a method of forming a film on a semiconductor wafer (hereinafter, referred to as "wafer"), there is known an atomic layer deposition (ALD) method in which a raw material gas and a reaction gas are sequentially supplied to the wafer to deposit a molecular layer (or an atomic layer) of a reaction product on the surface of the wafer, thereby forming a thin film on the wafer. When the film forming process according to the ALD method is performed on the wafer in which asperities are formed in a circuit pattern, a film conforming to the asperities (a film having a conformal shape) is formed.

Meanwhile, as a method of forming a contact hole, a self-aligned contact hole forming method is used in view of the fact that a pattern is miniaturized and a high accuracy is also required for pattern alignment. Further, since three-dimensionalization of the semiconductor device is further developing, for example, a contact hole or groove portion tends to be minute and an aspect ratio tends to be larger. For this reason, for example, when a process of filling the self-aligned contact hole with a silicon nitride film by the ALD method is performed, there is concern that a clearance such as a void, a seam or the like may be created in a filled portion (silicon nitride film) within the contact hole.

For example, a technique for forming a fluorocarbon film (CF film) is known. The film is formed within a depression formed in an aluminum layer by using a CF-based gas and a CH-based gas to fill the depression. The CF film is etched using an oxygen gas while halting the filling of the depression and then the CF film filling process is performed. Unlike the present disclosure, however, this technique does not consider a difference in incubation time among regions in which a film is formed.

SUMMARY

Some embodiments of the present disclosure provide a technique for forming a film to fill a depression pattern formed in a surface of a substrate with no clearance.

According to one embodiment of the present disclosure, there is provided a semiconductor device manufacturing method which includes: a primary process of supplying a process gas to a substrate having a depression formed therein to form a third layer and filling the depression with the third layer, the substrate including a first layer whose surface is exposed as an upper surface of the substrate and a second layer formed in at least a sidewall of the depression having the sidewall and a floor surface; subsequently performing an etching process of etching the third layer to expose the upper surface of the substrate, and halting the etching of the third layer while remaining the third layer formed within the depression; and subsequently performing a secondary process of supplying the process gas to the substrate to form the third layer so that the depression is filled with the third layer with no clearance, wherein an incubation time on the surface of the first layer is longer than that on a surface of the second layer when the process gas is supplied.

According to another embodiment of the present disclosure, there is provided a semiconductor device manufacturing system of performing a process with respect to a substrate having a depression formed therein, the substrate including a first layer whose surface is exposed as an upper surface of the substrate and a second layer formed in at least a sidewall of the depression having the sidewall and a floor surface, the system including: a film forming apparatus configured to supply a process gas to the substrate under a vacuum atmosphere to form a third layer; an etching apparatus configured to etch the third layer; a transfer mechanism configured to transfer the substrate between the film forming apparatus and the etching apparatus; and a control part configured to control: the film forming apparatus to execute filling the depression with the third layer, followed by transferring the substrate from the film forming apparatus to the etching apparatus; the etching apparatus to execute etching the third layer until the upper surface of the substrate is exposed, followed by transferring the substrate from the etching apparatus to the film forming apparatus; subsequently, the film forming apparatus to execute supplying the process gas to the substrate to form the third layer such that the depression is filled with the third layer with no clearance, wherein an incubation time on the surface of the first layer is longer than that on a surface of the second layer when the process gas is supplied.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
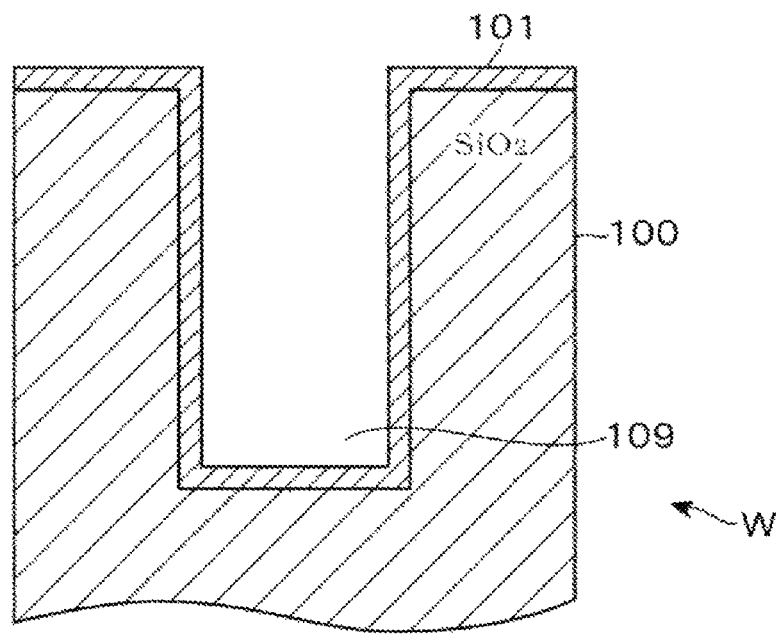
FIG. 1 is a longitudinal sectional view showing the vicinity of a surface of a wafer.

An example of a surface structure of a wafer W as a substrate used in manufacturing a semiconductor device, which is used in a semiconductor device manufacturing method according to an embodiment of the present disclosure, will be described. FIG. 1 shows the surface structure of the wafer W in the course of a process of manufacturing a semiconductor device. In this surface structure, a silicon oxide film ($SiO_2$ film) 100 corresponding to a first layer is etched to form a hole 109 which is a depression. In addition, a surface of the $SiO_2$ film 100 including the hole 109 is nitrided to form a barrier film 101 composed of a silicon nitride film, which corresponds to a second layer. Although the silicon nitride film is theoretically expressed as $Si_3N_4$, this silicon nitride film is briefly referred to as an "SiN film" herein.

Figure 2:
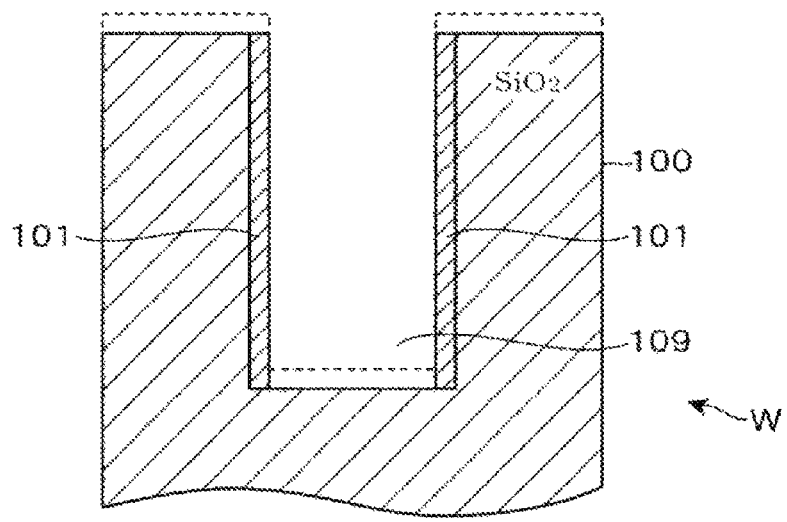
FIG. 2 is a longitudinal sectional view showing the vicinity of the surface of the wafer.

Thereafter, the barrier film 101 is dry-etched by supplying, for example, $CF_4$ gas toward the wafer W. With this, as shown in FIG. 2, portions of the barrier film 101 formed on a surface of the wafer W and on a floor surface of the hole 109 are removed so that the $SiO_2$ film 100 is exposed. At this time, portions of the barrier film 101 formed on side surfaces of the hole 109 remains unremoved. An aspect ratio (depth/diameter) of a contact hole thus formed is, for example, 1 to 50.

Subsequently, the wafer W is loaded into a film forming apparatus configured to form a film using, for example, ALD. In the film forming apparatus, a first film forming process which is a primary process of forming a SiN film corresponding to a third layer on the surface of the wafer W is performed. In the film forming apparatus, a silicon-containing gas such as dichlorosilane (DCS), and plasma (ammonia plasma) obtained by plasmarizing an $NH_3$ gas are alternately supplied toward the wafer W several times. As a result, DCS is adsorbed onto the surface of the wafer W, and subsequently, DCS and ammonia plasma react with each other to form a molecular layer of SiN. Such molecular layers are sequentially laminated to form the SiN film.

Figure 3:
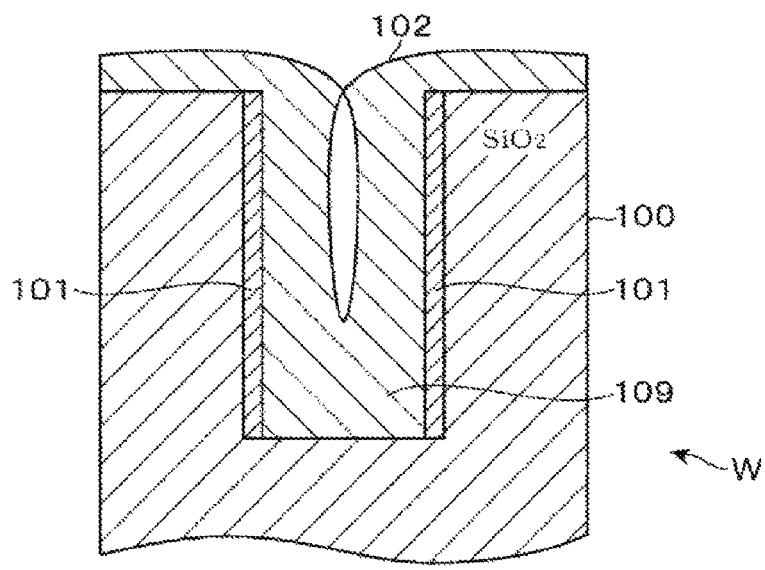
FIG. 3 is a longitudinal sectional view showing the vicinity of the surface of the wafer.

However, if the hole 109 is minute and has a deep depth, in other words, if the aspect ratio of the hole 109 is high, a SiN film 102 corresponding to the third layer occludes an upper portion of the hole 109 before fully filling the hole 109 without any clearance, whereby a clearance such as a void or seam may be created in the SiN film 102 filling the hole 109, as shown in FIG. 3.

Subsequently, the wafer W that has been subjected to the first film forming process is unloaded from the film forming apparatus and is then loaded into, for example, a liquid treatment apparatus in which known wet-etching is performed. The wafer W loaded into the liquid treatment apparatus is immersed in a phosphoric acid solution which is heated to 160 to 165 degrees C. Examples of such an etching process may include a method of supplying an etching solution from an upper nozzle to the wafer W while adsorbing the wafer W onto a spin chuck and rotating the spin chuck, a method of immersing a plurality of wafers W in an etching solution in a batch manner, or the like. A timing at which the etching process is halted may be a timing at which an upper surface of the SiN film 102 becomes lower than a level of an opening of the hole 109 and at which the clearance (for example, void) is exposed.

Figure 4:
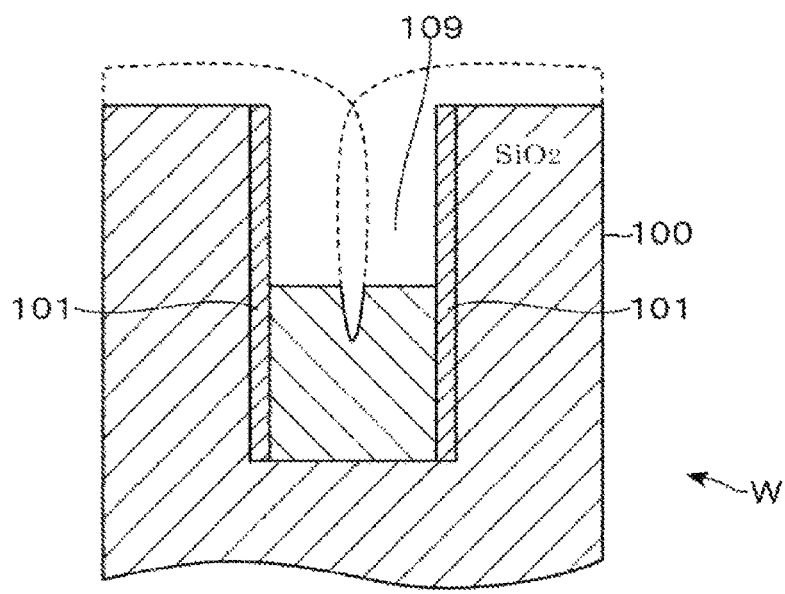
FIG. 4 is a longitudinal sectional view showing the vicinity of the surface of the wafer.

If the etching process is halted at the timing at which the clearance is exposed as described above, the clearance is filled by second and subsequent film forming processes (to be described later). Therefore, as compared with a case where the etching process is carried out until the clearance is eliminated, an etching time and a film forming time in a subsequent process are shortened, thereby enhancing process efficiency. FIG. 4 shows a state of the surface of the wafer W after the etching process, wherein the $SiO_2$ film 100 on the surface of the wafer W is exposed and a portion of the surface side of the SiN film 102 filled in the hole 109 has been removed.

The wafer W that has been subjected to the etching process is unloaded from the liquid treatment apparatus and is loaded into, for example, the film forming apparatus used in the first film forming process. Then, the second film forming process of forming a SiN film is performed. Similarly to the first film forming process, DCS and plasma (ammonia plasma) obtained by plasmarizing an $NH_3$ gas are alternately supplied several times in the second film forming process.

In the surface of the wafer W after the etching process that has been already described, the surface of the $SiO_2$ film 100 is exposed. Thus, a target region in which the SiN film will be formed includes the surface of the $SiO_2$ film 100, the barrier film (SiN film) 101 and a surface of the SiN film 102 filled in the hole 109. As for an incubation time during which the SiN film is formed on the surfaces, an incubation time for the $SiO_2$ film 100 is longer than those for the barrier film 101 and the SiN film 102. The incubation time means a time period from when a film-forming process gas is supplied to a target surface till when a thin film starts to be formed. A reason for occurrence of the incubation time may be that as for a relationship between a target surface and species for film formation, there may be a case where nuclei from which growth of a film occurs are required to be formed on the target surface, so that it takes time to form the nuclei after the process gas is supplied to the target surface.

Figure 5:
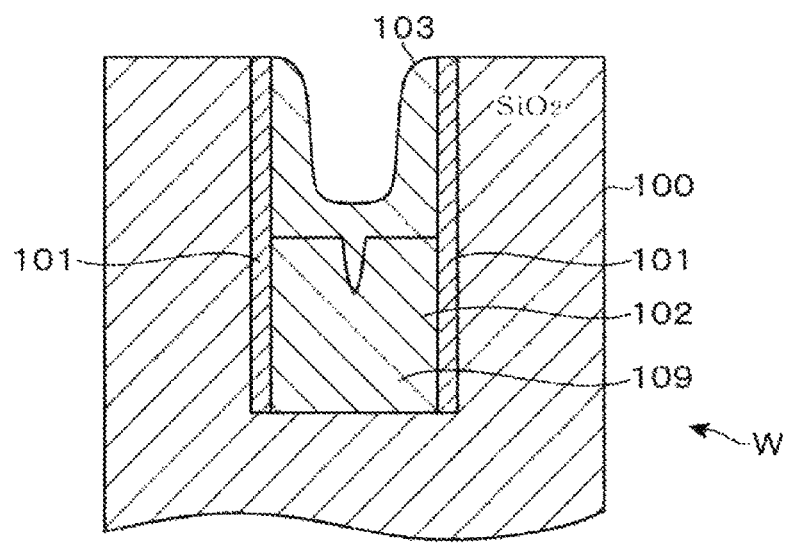
FIG. 5 is a longitudinal sectional view showing the vicinity of the surface of the wafer.

On the surface of the $SiO_2$ film 100, nuclei required for initiating lamination of molecular layers of SiN are not formed in parallel with the supply of the process gas, but are formed after a short delay. Meanwhile, the barrier film 101 and a film to be formed (a SiN film 103 corresponding to a fourth layer) are homogeneous in terms of compounds. Thus, the formation of the SiN film 103 is performed almost simultaneously with the supply of the process gas on the surface of the barrier film 101. FIG. 5 schematically shows a state where the film formation has proceeded on the surfaces of the barrier film 101 and the SiN film 102 but the film formation has not yet been initiated on the surface of the $SiO_2$ film 100. In FIG. 5, the state where the film formation has proceeded on the barrier film 101 and the SiN film 102 is emphatically shown. Therefore, observing a film thickness of the SiN film 103 at any timing after the supply of the process gas, a film thickness of a portion of the SiN film 103 on an inner peripheral surface of the hole 109 is greater than that thereof on the surface of the $SiO_2$ film 100.

Figure 6:
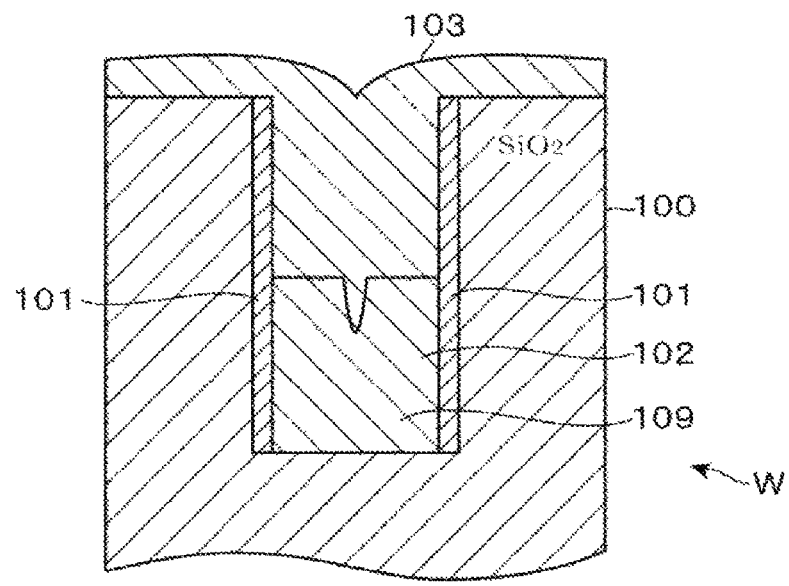
FIG. 6 is a longitudinal sectional view showing the vicinity of the surface of the wafer.

Therefore, when the film formation is further performed in the state shown in FIG. 5, it is possible to completely fill the hole 109 with the SiN film 103 without any clearance before the SiN film 103 formed on the surface side of the SiO$_2$ film 100 and coming in from the vicinity of the upper portion of the hole 109 occludes the upper portion of the hole 109, as shown in FIG. 6.

Figure 7:
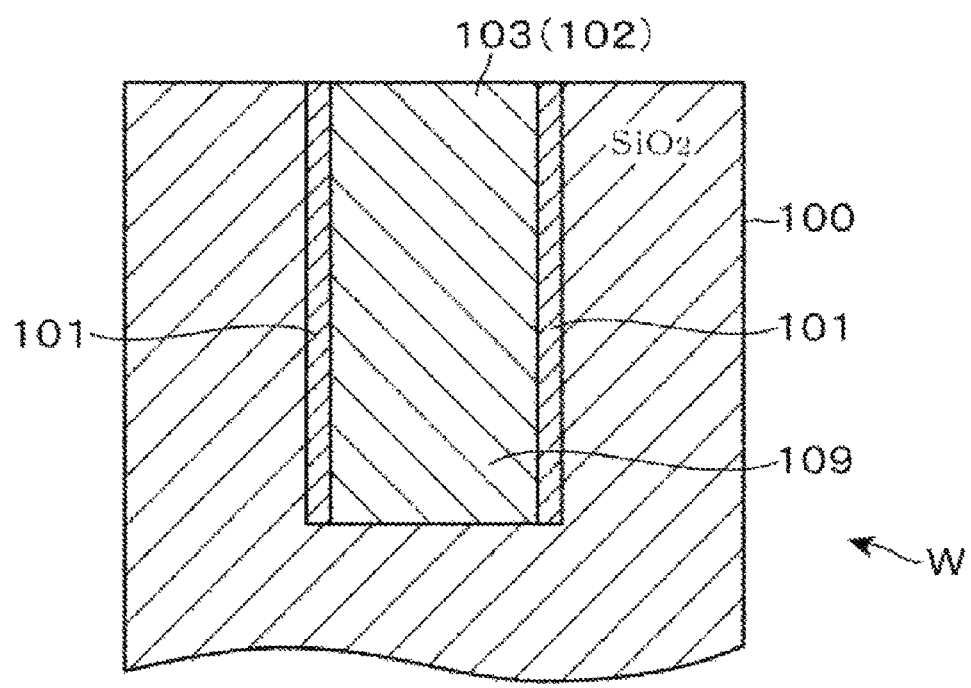
FIG. 7 is a longitudinal sectional view showing the vicinity of the surface of the wafer.

Subsequently, the wafer W is polished by, for example, CMP (chemical mechanical polishing) to remove the SiN film 103 formed on the surface of the SiO$_2$ film 100. Accordingly, as shown in FIG. 7, the SiO$_2$ film 100 is exposed at the surface of the wafer W and the hole 109 remains filled with the SiN film 103(102).

Figure 8:
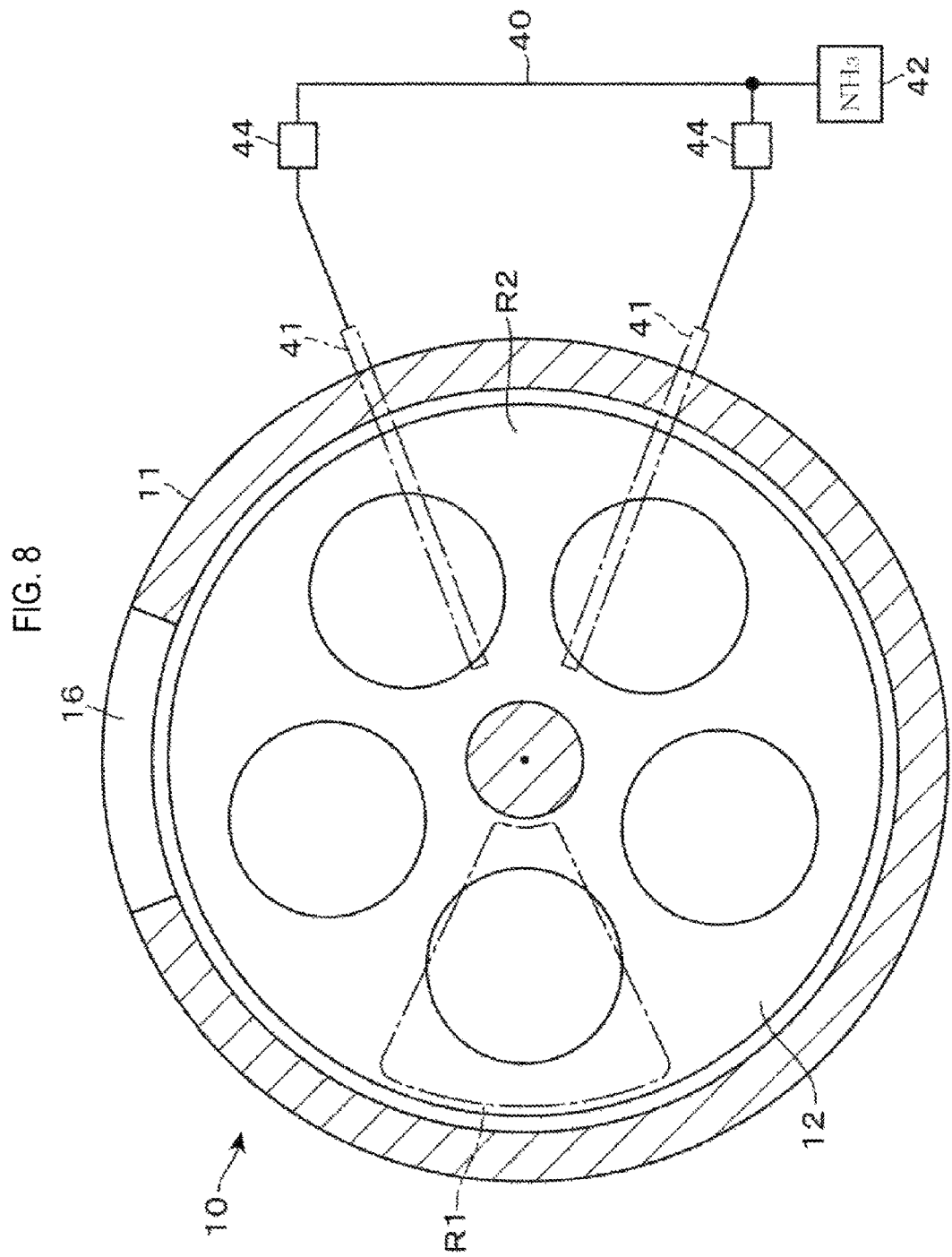
FIG. 8 is a plan view of a film forming apparatus.
Figure 9:
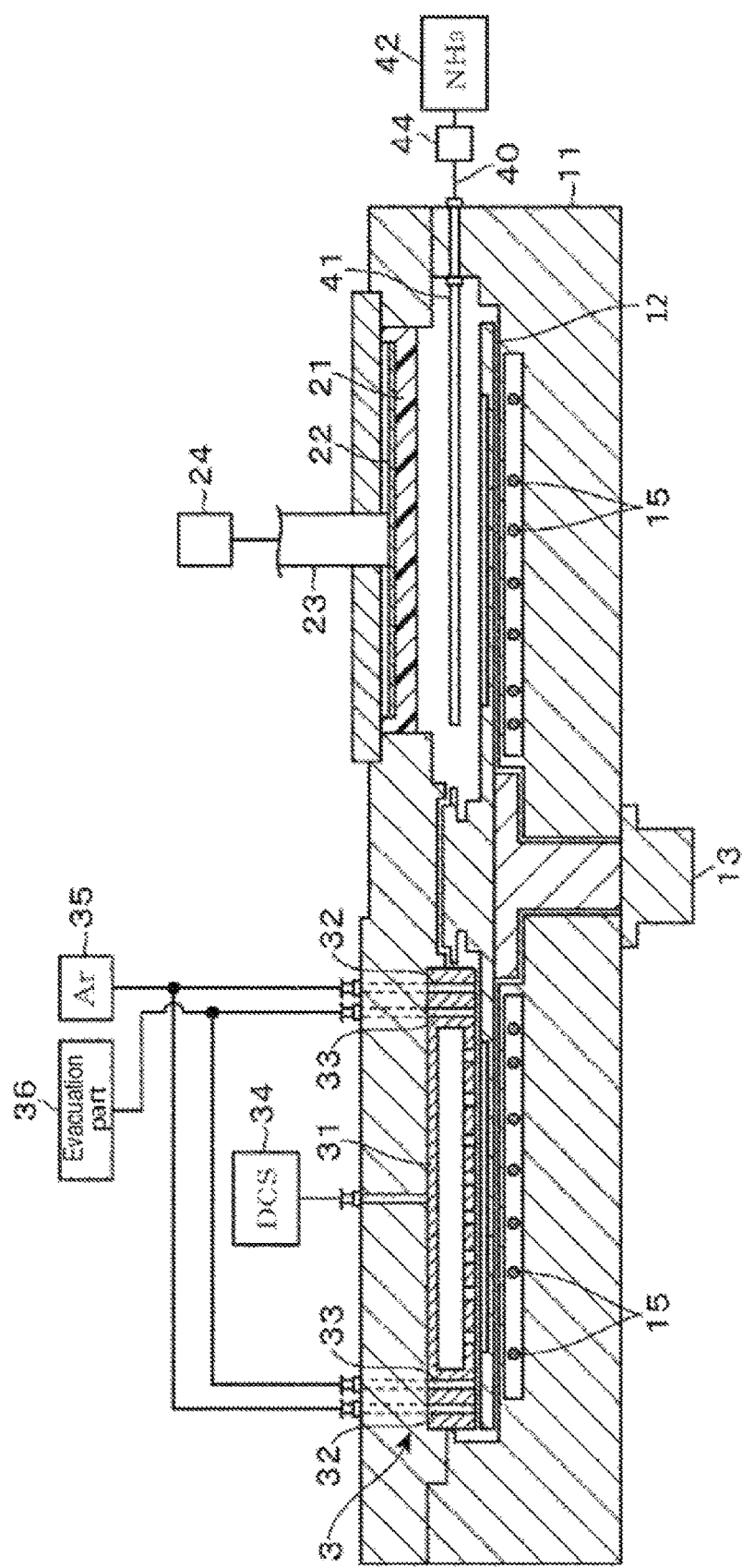
FIG. 9 is a sectional view of the film forming apparatus.

An example of a film forming apparatus configured to form the SiN films 102 and 103 on the wafer W will be described. As shown in FIGS. 8 and 9, a film forming apparatus 10 includes a flat cylindrical vacuum container 11 and a rotary table 12 installed in the vacuum container 11. For example, five sheets of wafers W are mounted on the rotary table in a circumferential direction. A rotation mechanism 13 is connected to the rotary table 12 to rotate the rotary table 12 about a vertical axis. In the vacuum container 11, a heater 15 configured to heat the wafer W mounted on the rotary table 12 is installed below a portion of the rotary table 12 on which the wafer W is mounted. A raw material gas supply region R1 and a nitriding gas supply region R2 are defined in the vacuum container 11 in a rotational direction of the rotary table 12.

A gas supply/exhaust part 3 is installed above the rotary table 12 in the raw material gas supply region R1. A central region of the gas supply/exhaust part 3 is defined as a gas shower head 31. The gas shower head 31 is configured to downwardly supply a DCS gas which is a raw material gas. When the wafer W mounted on the rotary table 12 is located at the raw material gas supply region R1, the DCS gas is supplied to and adsorbed onto the surface of the respective wafer W. Furthermore, an annular separation gas discharge port 32 is formed in a lower surface of the gas supply/exhaust part 3 along a periphery thereof. In addition, an annular exhaust port 33 is formed between the separation gas discharge port 32 and the gas shower head 31 along the separation gas discharge port 32. The separation gas discharge port 32 is configured to supply an argon (Ar) gas as a separation gas to a lower periphery of the gas supply/exhaust part 3 in the raw material gas supply region R1. Moreover, the exhaust port 33 exhausts the DCS gas supplied from the gas shower head 31 toward the wafer W, and suction-exhausts the separation gas. The exhaust of the DCS gas through the exhaust port 33 and the discharge of the separation gas from the separation gas discharge port 32 form a flow biased to the exhaust port 33. This prevents the DCS gas from flowing out of the raw material gas supply region R1. In FIG. 9, reference numeral 34 indicates a DCS gas supply source, reference numeral 35 indicates a separation gas supply source, and reference numeral 36 indicates an exhaust part.

For example, the nitriding gas supply region R2 is defined as a region formed between two gas nozzles 41 configured to supply an NH$_3$ gas. Microwaves are supplied to the nitriding gas supply region R2 from above. In FIG. 8, reference numeral 40 indicates a gas supply pipe, reference numeral 42 indicates a NH$_3$ gas supply source, and reference numeral 44 indicates a flow rate adjusting part. Further, in FIG. 9, reference numeral 21 indicates a dielectric window, reference numeral 22 indicates a dielectric plate, reference numerals 23 indicates a waveguide, and reference numeral 24 indicates a microwave supply part. In addition, the NH$_3$ gas is supplied to the nitriding gas supply region R2 and subsequently, the microwaves are supplied to the nitriding gas supply region R2 such that the NH$_3$ gas is plasmarized. Then, when the wafer W with the surface onto which DCS is adsorbed enters the nitriding gas supply region R2 with the rotation of the rotary table 12, DCS adsorbed onto the surface of the wafer W and the ammonia plasma react with each other to form a molecular layer of SiN. By rotating the rotary table 12 with the wafers W mounted thereon, the wafers W are allowed to alternately pass through the respective regions. In this way, the adsorption of the raw material gas and the nitridation of the raw material gas thus adsorbed are repeatedly performed to laminate SiN films.

Figure 10:
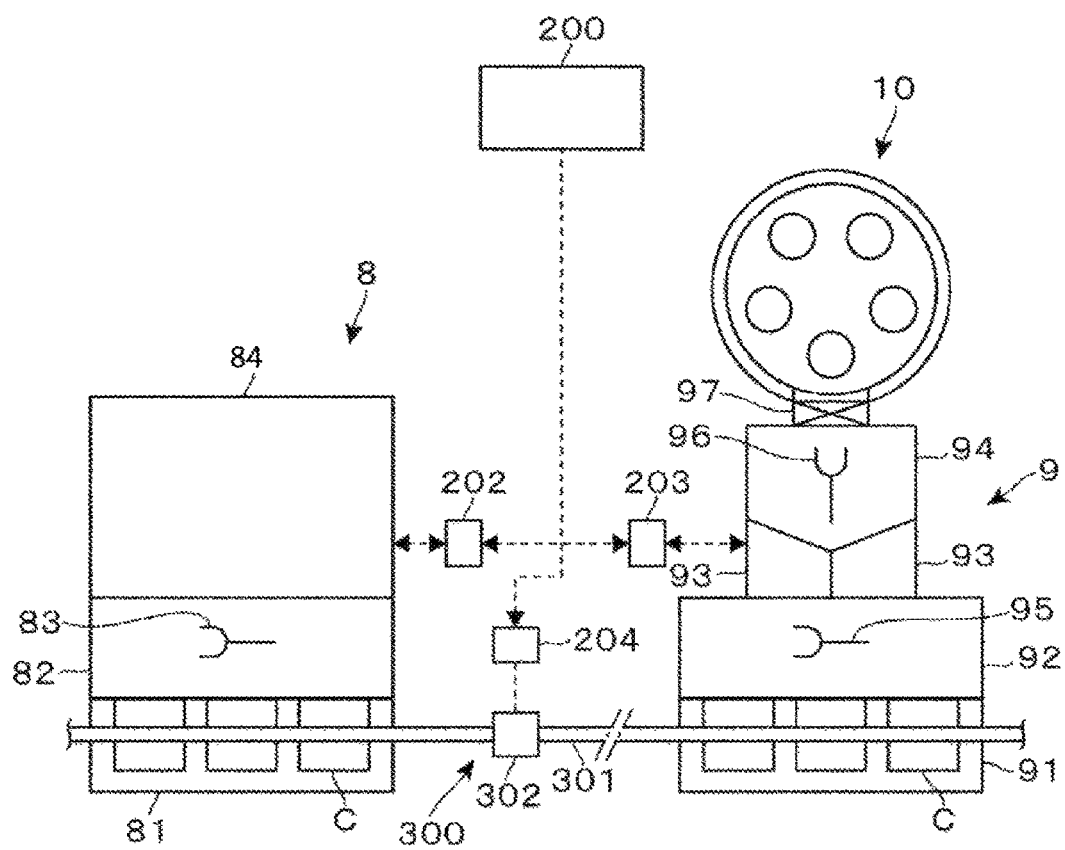
FIG. 10 is a plan view of a substrate processing system according to an embodiment of the present disclosure.

Subsequently, an example of a substrate processing system as a semiconductor device manufacturing system which implements the semiconductor device manufacturing method according to the present disclosure, will be described. As shown in FIG. 10, the substrate processing system includes a vacuum treatment system 9 configured to form a SiN film on a wafer W. The vacuum treatment system 9 includes the film forming apparatus 10 described above, and a carrier mounting part 91 on which carriers C with wafers W accommodated therein are mounted. The wafer W taken out from the carrier C mounted on the carrier mounting part 91 is loaded into the film forming apparatus 10 via an atmospheric-pressure transfer chamber 92, a load lock chamber 93 and a vacuum transfer chamber 94. In FIG. 10, reference numerals 95 and 96 indicate transfer arms respectively installed in the atmospheric-pressure transfer chamber 92 and the vacuum transfer chamber 94, and reference numeral 97 indicates a gate valve configured to open and close a transfer port 16 shown in FIG. 8.

Furthermore, the substrate processing system includes a liquid treatment system 8 configured to etch the SiN film formed on the wafer W. The liquid treatment system 8 includes a carrier mounting part 81, a delivery part 82 equipped with a transfer arm 83, and a liquid treatment part 84. The liquid treatment part 84 includes, for example, an etching part configured to etch the SiN film 102 by immersing the wafer W in a liquid bath storing a heated phosphoric acid as an etching liquid, a cleaning part configured to wash the phosphoric acid remaining on the wafer W, and the like. In the carrier mounting part 81, the wafer W taken out from the carrier C is transferred to the liquid treatment part 84 by the transfer arm 83 and is returned to the respective carrier C after the liquid treatment.

Moreover, the substrate processing system includes, for example, a ceiling transfer mechanism 300. The ceiling transfer mechanism 300 includes a guide rail 301 disposed along a ceiling and a transfer part 302 configured to transfer the carrier C.

Furthermore, the substrate processing system includes controllers 202, 203 and 204 configured to control the liquid treatment system 8, the vacuum treatment system 9 and the ceiling transfer mechanism 300, respectively. Each of the controllers 202, 203 and 240 are instructed by a host computer 200 which is a higher-level control part. For example, the host computer 200 includes a program for sequentially carrying out a process of performing the first film forming process of the SiN film 102 with respect to the wafer W shown in FIG. 2 in the vacuum treatment system 9, a process of performing the etching process of the SiN film 102 in the liquid treatment system 8, and a process of returning the wafer W to the vacuum treatment system 9 and performing the second film forming process of the SiN film 103.

In the embodiment described above, the SiN film 102 is formed by, for example, ALD to fill the depression 109 formed in the SiO$_2$ film 100, and subsequently, the SiN film 102 is etched by, for example, the wet etching, until the SiO$_2$ film 100 as the surface of the wafer W is exposed. Thereafter, the filling processing (film forming process) with the SiN film 103 is performed again. As previously described in detail, the incubation time (a delay time from when a process gas is supplied till when a film starts to be formed) related to the formation of the SiN film 103 on the SiO$_2$ film 100 is longer than that on the barrier film 101. For this reason, in the subsequent filling process with the SiN film 103 after the etching process, the depression 109 is filled with the SiN film 103 before the SiN film 103 flows into an upper portion of the depression 109 from the upper surface side of the SiO$_2$ film 100. It is therefore possible to suppress creation of a clearance such as a void, a seam or the like.

In the embodiment described above, the etching process and the subsequent film forming process has been described to be performed once, respectively. However, if there is a concern that a clearance may be created due to circumstances such as a considerably large aspect ratio of the hole 109 by performing each of the processes once, a further etching process and a subsequent film forming process may be repeated one or more times after the second film forming process is performed.

Figure 11:
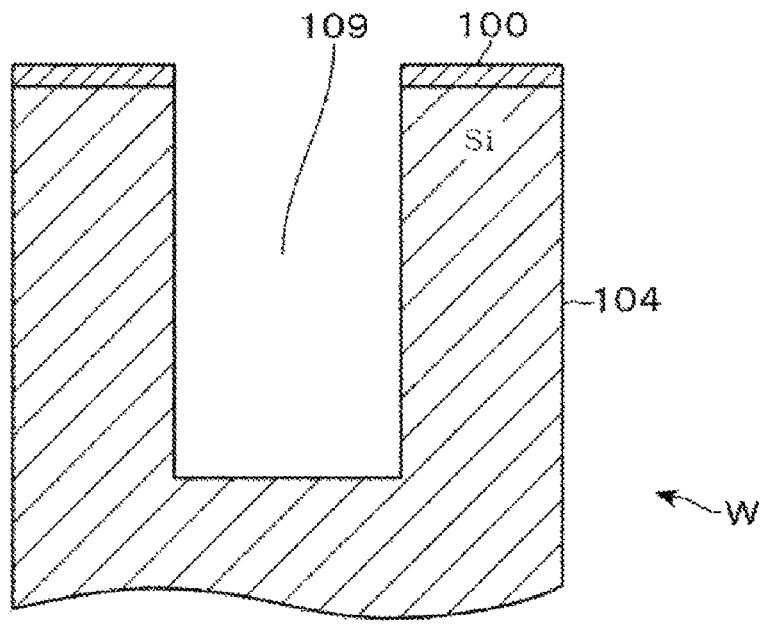
FIG. 11 is a longitudinal sectional view showing the vicinity of a surface of another exemplary wafer.

Another example of a substrate used for manufacturing a semiconductor device will be described. As shown in FIG. 11, for example, as a wafer W before a first film forming process is performed, the wafer may have a configuration in which a SiO$_2$ film 100 as a first layer is formed on a surface of a silicon layer 104 as a second layer and a hole 109 is formed to penetrate through the SiO$_2$ film 100 and the silicon layer 104. In such a wafer W, most side surfaces of the hole 109 are made of silicon. For this reason, in a case where a film is formed to fill the hole with, for example, SiN, the hole 109 can be filled with SiN by using a difference in incubation time between the silicon and the SiO$_2$. Thus, the present disclosure can be applied to the example.

Figure 12:
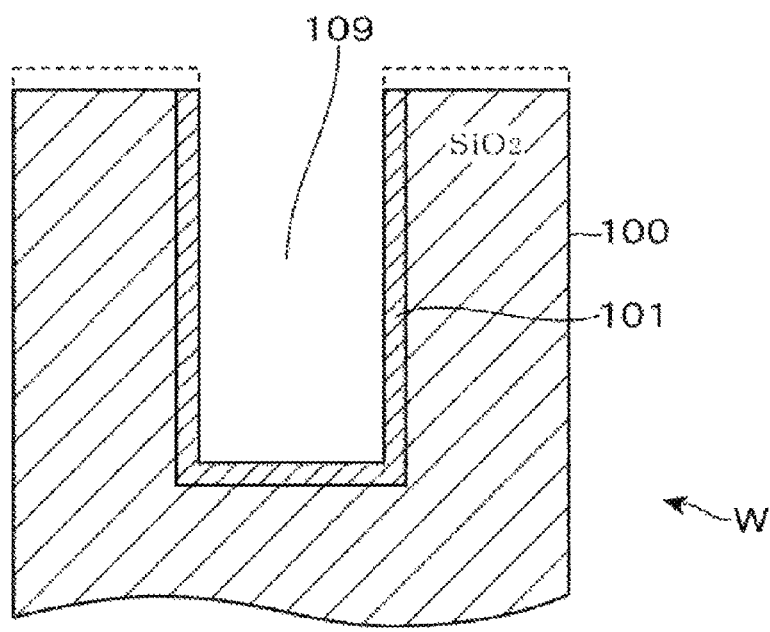
FIG. 12 is a longitudinal sectional view showing the vicinity of a surface of yet another exemplary wafer.

Further, the chemical mechanical polishing (CMP) method may be used in removing a barrier film 101 as a surface of the wafer W excluding inner surfaces of the hole 109 so as to expose the SiO$_2$ film 100 as the surface of the wafer W. Since the surface of the wafer W is removed through polishing by the CMP method, the barrier film 101 on a floor surface within the hole 109 may remain as shown in FIG. 12. For this reason, when a SiN film 102 is subsequently formed in the first film forming process, a thickness of the SiN film is quickly increased on the floor surface within the hole 109 because the SiN film is laminated on the barrier film 101. Since a formation such as a void, a seam or the like is formed between SiN films growing from respective side surfaces of the hole 109, the increase in the thickness of the SiN film laminated on the floor surface within the hole 109 makes it difficult to create such a formation at a deep position in the hole 109. Accordingly, in an etching process, it is possible to reduce etching of the SiN film 102 filled in the hole 109.

Further, the etching process of etching the SiN film 102 may be performed by a dry etching using a gas such as CF$_4$, NF$_3$, CH$_2$F$_2$, C$_4$F$_8$, C$_4$F$_6$, C$_3$F$_8$, CHF$_3$ and the like. In this case, an etching module (a module with equipment and devices for performing the dry etching installed in a vacuum container) configured to perform the dry etching may be connected to the vacuum transfer chamber 94 of the vacuum treatment system 9 shown in FIG. 10. According to the vacuum treatment system 9 configured as above, the transfer arm 96 of the vacuum transfer chamber 94 transfers the wafer W between the film forming apparatus 10 and the etching module (etching apparatus). Therefore, even when the processes of film formation→etching→film formation are performed and further processes of etching→film formation are subsequently performed at least once, high throughput may be achieved.

Further, the film forming apparatus 10 may be, for example, a single-wafer type film forming apparatus in which a single wafer W is loaded into and processed in a vacuum container. Alternatively, the film forming apparatus 10 may be a film forming apparatus that performs the chemical vapor deposition (CVD) method in which a raw material gas and a reaction gas are supplied to a wafer W to laminate molecular layers (or atomic layers) on a surface of the wafer W.

According to the present disclosure, when a depression formed in a substrate used for manufacturing a semiconductor device is filled under a condition that an incubation time at an upper surface of the substrate is longer than that on a side surface of the depression, such a filling process is performed until halfway and subsequently, an etching process is performed until the upper surface of the substrate is exposed (so-called "etch-back"). Thereafter, the filling process is resumed. Therefore, when the filling process is resumed, the difference in incubation time between the upper surface of the substrate and the side surface of the depression makes it difficult for a film to occlude an upper portion of the depression. It is therefore possible to perform a filling process (film forming process) while suppressing creation of a clearance.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device manufacturing method, comprising:
a primary process of supplying a process gas to a substrate having a depression formed therein to form a third layer and filling the depression with the third layer, the substrate including a first layer whose surface is exposed as an upper surface of the substrate and a second layer formed in at least a sidewall of the depression having the sidewall and a floor surface;
subsequently performing an etching process of etching the third layer to expose the upper surface of the substrate, and halting the etching of the third layer while remaining the third layer formed within the depression; and
subsequently performing a secondary process of supplying the process gas to the substrate to form a fourth layer so that the depression is filled with the fourth layer with no clearance,
wherein an incubation time on the surface of the first layer is longer than that on a surface of the second layer when the process gas is supplied.

2. The method of claim 1, wherein the etching process is halted in a state where a clearance created in the third layer within the depression during the primary process is exposed.

3. The method of claim 1, wherein the depression is formed in the first layer and the sidewall of the depression is covered with the second layer.

4. The method of claim 3, wherein the first layer is a silicon oxide layer, the second layer is a silicon nitride layer and the third layer is a silicon nitride layer.

5. The method of claim 4, wherein the etching process includes bring the substrate into contact with a heated phosphoric acid solution as an etching solution.

6. The method of claim 1, wherein, after the secondary process, the etching process and the secondary process are repeated at least once.

* * * * *